(12) United States Patent
Liaw

(10) Patent No.: US 11,495,537 B2
(45) Date of Patent: Nov. 8, 2022

(54) INTERCONNECT STRUCTURE IN SEMICONDUCTOR DEVICES

(71) Applicant: Taiwan Semiconductor Manufacturing Co., Ltd., Hsinchu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 166 days.

(21) Appl. No.: 16/846,861

(22) Filed: Apr. 13, 2020

(65) Prior Publication Data

US 2020/0243438 A1 Jul. 30, 2020

Related U.S. Application Data

(63) Continuation of application No. 15/935,871, filed on Mar. 26, 2018, now Pat. No. 10,622,306.

(51) Int. Cl.
| | |
|---|---|
| *H01L 23/528* | (2006.01) |
| *H01L 27/092* | (2006.01) |
| *H01L 27/02* | (2006.01) |
| *H01L 29/06* | (2006.01) |
| *H01L 23/535* | (2006.01) |

(52) U.S. Cl.
CPC ......... *H01L 23/528* (2013.01); *H01L 23/535* (2013.01); *H01L 27/0207* (2013.01); *H01L 27/0924* (2013.01); *H01L 29/0649* (2013.01)

(58) Field of Classification Search
CPC .................................................. H01L 23/528
See application file for complete search history.

(56) References Cited

U.S. PATENT DOCUMENTS

| | | | |
|---|---|---|---|
| 7,920,403 B2 | 4/2011 | Liaw | |
| 8,373,230 B1 | 2/2013 | Or-Bach | |
| 9,633,999 B1 | 4/2017 | Lu et al. | |
| 2009/0065871 A1 | 3/2009 | Lin et al. | |
| 2012/0313256 A1* | 12/2012 | Lu | H01L 21/31144 257/E21.586 |
| 2016/0020210 A1 | 1/2016 | Liaw | |
| 2016/0181257 A1* | 6/2016 | Liaw | H01L 23/5286 257/401 |

(Continued)

FOREIGN PATENT DOCUMENTS

| | | |
|---|---|---|
| CN | 102593096 A | 7/2012 |
| CN | 102820280 A | 12/2012 |

(Continued)

*Primary Examiner* — Walter H Swanson
(74) *Attorney, Agent, or Firm* — Haynes and Boone, LLP

(57) ABSTRACT

A semiconductor device includes transistors over a substrate, and first, second, and third metallization layers over the transistors. The first, second, and third metallization layer includes first, second, and third metal features, respectively. The second metal features are oriented lengthwise substantially perpendicular to the first metal features, and the third metal features are oriented lengthwise substantially parallel to the first metal features. The first, second, and third metal features have a first, second, and third thickness, respectively, along a first direction perpendicular to a top surface of the substrate. The second thickness is smaller than both the first and the third thicknesses.

20 Claims, 10 Drawing Sheets

(56) References Cited

U.S. PATENT DOCUMENTS

| | | |
|---|---|---|
| 2017/0047335 A1 | 2/2017 | Choi et al. |
| 2017/0179240 A1 | 6/2017 | Radens et al. |
| 2018/0006017 A1 | 1/2018 | Wang et al. |
| 2019/0013314 A1* | 1/2019 | Choi .................. H01L 29/0649 |
| 2019/0295940 A1 | 9/2019 | Liaw |

FOREIGN PATENT DOCUMENTS

| | | |
|---|---|---|
| CN | 104778970 A | 7/2015 |
| CN | 107170824 A | 9/2017 |
| TW | I249227 | 2/2006 |
| TW | I459524 | 11/2014 |

\* cited by examiner

INTERCONNECT STRUCTURE IN SEMICONDUCTOR DEVICES

PRIORITY DATA

The present application is a continuation application of U.S. patent application Ser. No. 15/935,871, filed Mar. 26, 2018, which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, in integrated circuit designs (e.g., system-on-a-chip (or SOC), central processing units (CPU), or graphics processing units (GPU)), using standard cells (e.g., inverters, NAND, NOR, AND, OR, or flip-flops) has been a popular choice for its ease of handling complex designs. In these devices, metallization layers are formed over transistors and are used for routing signals and power lines (e.g., Vdd and ground) among the transistors. As the scaling down process continues, designing and fabricating such devices have encountered some challenges. For example, shrinking the geometry of power and/or ground lines typically increases the resistance thereof, which increases the power consumption of the devices. Also, placing signal lines closer in order to increase the design density typically increases coupling capacitance among the signal lines, which adversely impacts the performance of the devices. Accordingly, improvements in these areas are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
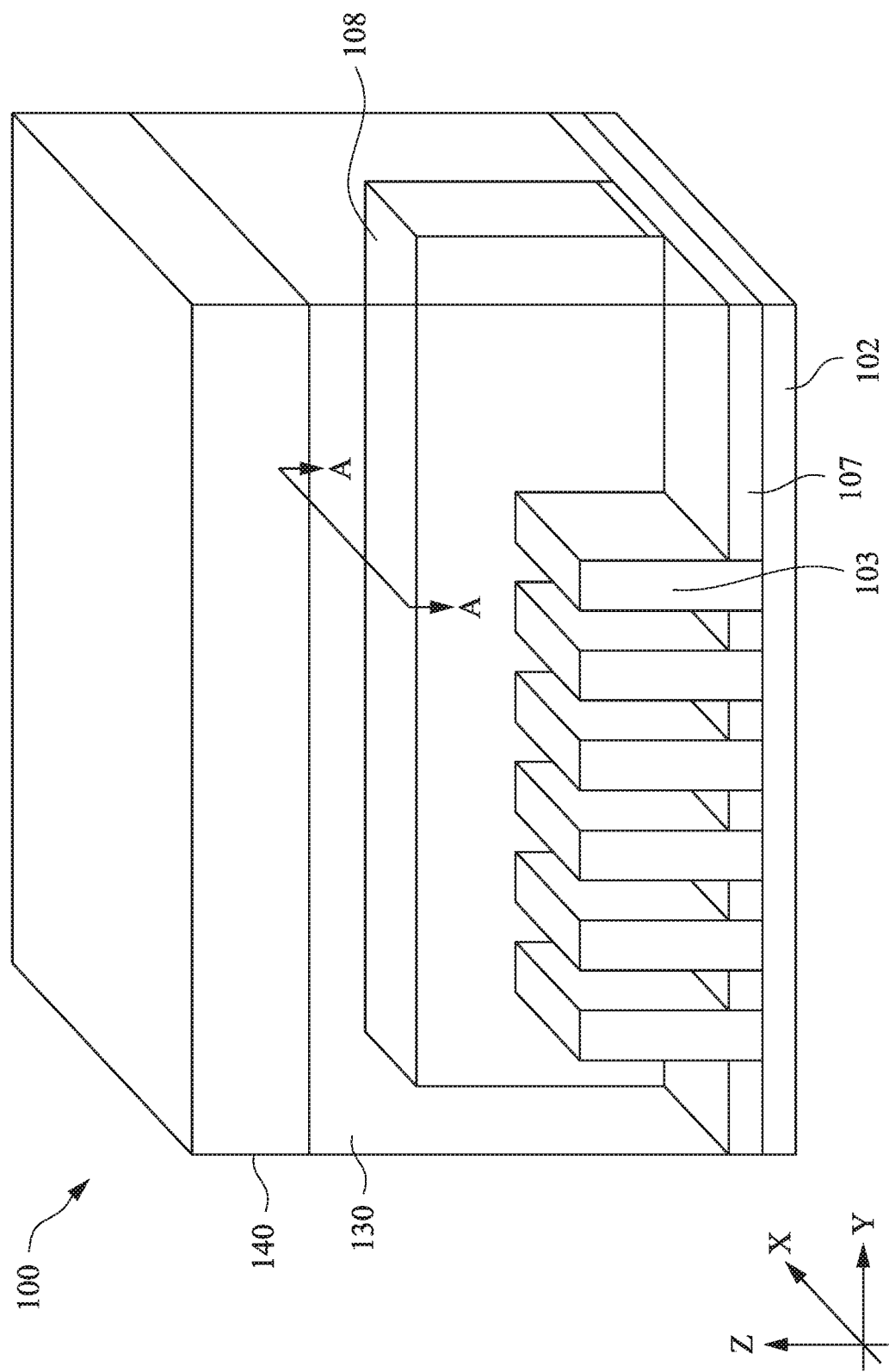
FIG. 1 shows a perspective view of a semiconductor device, in part, constructed according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within a reasonable percentage (e.g., +/−10%) of the number described as understood by a person having ordinary skill in the art, unless otherwise specified. For example, the term "about 5 nm" encompasses the dimension range from 4.5 nm to 5.5 nm.

The present disclosure is generally related to semiconductor devices and fabrication methods, and more particularly to integrate circuits (IC) designed and fabricated using standard cells such as inverters, NAND gates, NOR gates, AND gates, OR gates, flip-flops, or other suitable cells. A typical standard cell includes various transistors such as CMOSFETs having both PMOSFET and NMOSFET. In these ICs, metallization layers are formed over transistors of standard cells and provide for routing signals and power lines such as Vdd, Vss, and ground lines among transistors.

In an embodiment of the present disclosure, a first metallization layer is formed directly above the transistors and is used for routing power lines and some of the gate to drain connections across standard cells. For example, the power lines may provide Vdd, Vss, and/or ground connectivity to source terminals of transistors. Using the first metallization layer to route power lines reduces the connection length in these signals, thereby reducing power consumption. Above the first metallization layer is a second metallization layer that provides for routing signal lines mostly within standard cells and having relatively short connection length. Above the second metallization layer is a third metallization layer that provides for power line mesh structure that has relatively long connection length. Since the first and the third metallization layers provide for power line routing, lower resistance in the conductors therein is generally desired for reducing power consumption of the IC and for reducing power drop along the power lines. Also, since the power lines are relatively static, coupling capacitance on these conductors generally is not a concern. In contrast, since the second metallization layer provides for relatively shorter connection and for routing signal lines, lower coupling capacitance in the conductors therein is generally desired. For example, the signal lines in the second metallization layer may switch at a high frequency (e.g., few hundred MHz to few GHz). Having a lower coupling capacitance among the conductors therein generally improves the circuit performance.

One approach to reducing the coupling capacitance in the second metallization layer is to increase spacing between adjacent conductors therein. Since capacitance is inversely proportional to the distance between two conductors ($C=\varepsilon A/D$, where $\varepsilon$ is the permittivity of the dielectric material between the two conductors, A is the area of the two conductors, and D is the distance between the two conductors), increasing their spacing D decreases the coupling capacitance thereof. However, this also adversely decreases the device integration density. In an embodiment of the present disclosure, conductors in the second metallization layer are made thinner, which effectively reduces the coupling area A between adjacent conductors. Since capacitance is proportional to the areas of two conductors, reducing the areas of the conductors decreases the coupling capacitance thereof. Another unexpected benefit is that the thinner conductors can also be made narrower and placed closer to each other, which effectively increases device integration. In an embodiment of the present disclosure, conductors in the second metallization layer are made thinner than those in the first and the third metallization layers by at least 10% to greatly reduce the coupling capacitance in the second metallization layer. These and other aspects of the present disclosure are further described below in conjunction with FIGS. 1-7.

FIG. 1 illustrates a perspective view of a portion of a semiconductor device 100 constructed according to the present disclosure. The semiconductor device 100 as shown in FIG. 1 is for illustration purposes only, and does not limit the scope of the present disclosure to any particular number of fins, gates, transistors, dielectric layers, metallization layers, and/or other structures. For example, even though illustrated with fins and FinFETs, the semiconductor device 100 may include planar transistors in some embodiments. Furthermore, the semiconductor device 100 as shown in FIGS. 1-7 may be an intermediate device fabricated during processing of an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FinFETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Referring to FIG. 1, the semiconductor device 100 includes a substrate 102, a plurality of semiconductor fins 103 over the substrate 102, an isolation structure 107 that isolates the lower portions of the fins 103 from one another, and a plurality of gate stacks 108 (one shown) engaging one or more of the fins 103 to form FinFETs. The fins 103 and the gate stacks 108 (and various other components of the semiconductor device 100 not shown in FIG. 1) are covered in one or more dielectric layers 130. The semiconductor device 100 further includes three or more metallization layers 140 that have conductors fabricated according to aspects of the present disclosure. The metallization layers 140 provide for signal and power routing for the transistors of the semiconductor device 100. FIG. 1 further defines three directions X, Y, and Z for the convenience of following discussion. The X direction is the lengthwise direction of the fins 103, the Y direction is the widthwise direction of the fins 103 which is perpendicular to the X direction, and the Z direction is perpendicular to both the X and Y directions. In an embodiment, the Z direction is also perpendicular to a top surface of the substrate 102 (i.e., the Z direction is a normal of the top surface of the substrate 102). Sometimes, the Z direction is also referred to as the height direction of the fins 103 and the gate stacks 108.

Figure 2:
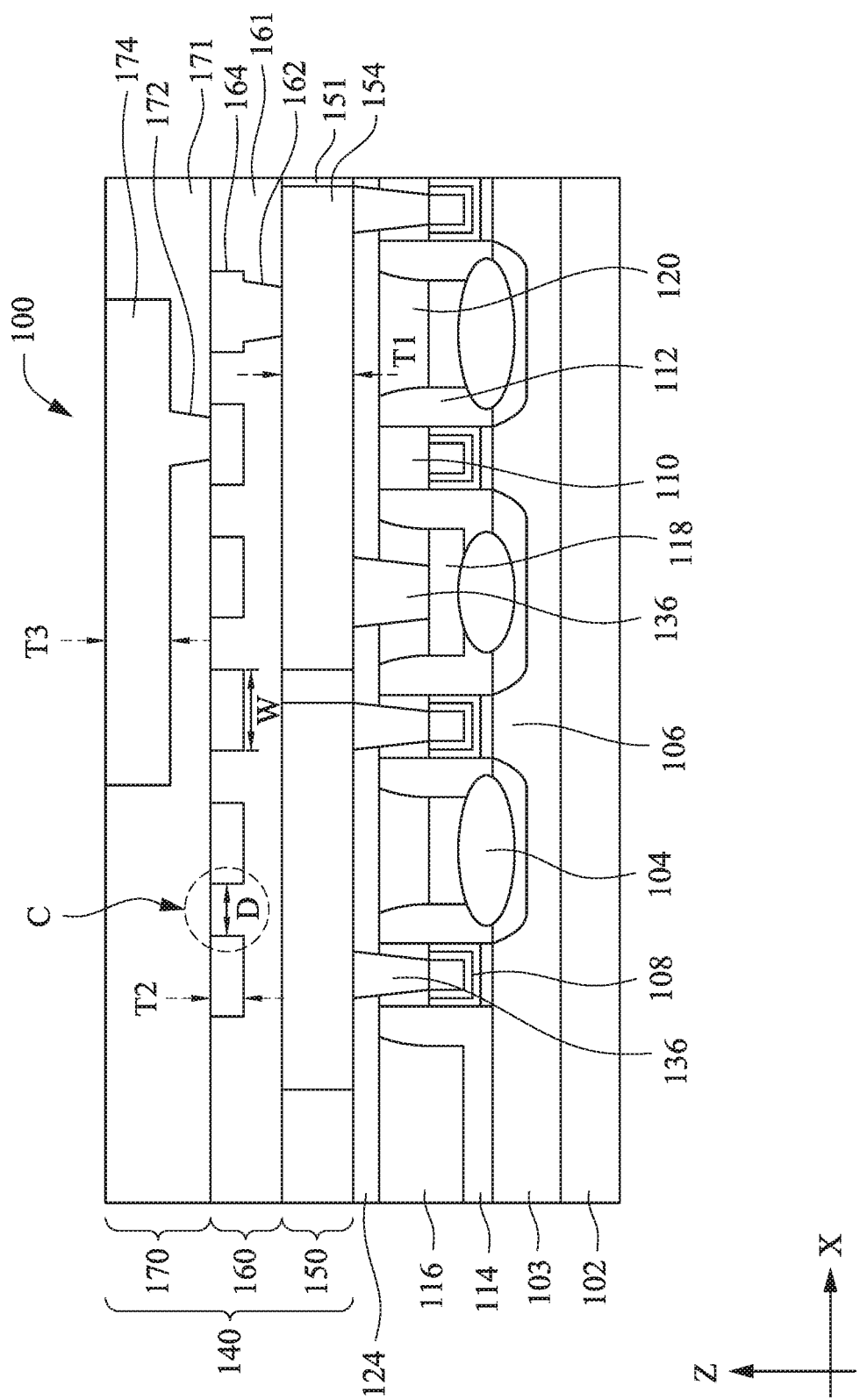
FIG. 2 shows a cross-sectional view of the semiconductor device of FIG. 1, in part, in accordance with some embodiments.

FIG. 2 shows a cross-sectional view of the semiconductor device 100 in the X-Z plane cut along the length of the fin 103 (the "A-A" line of FIG. 1). With reference to FIGS. 1 and 2 collectively, various components of the semiconductor device 100 are further described below.

The substrate 102 is a silicon substrate (e.g., a silicon wafer) in the present embodiment. Alternatively, the substrate 102 may comprise another elementary semiconductor, such as germanium; a compound semiconductor including silicon carbide, gallium nitride, gallium arsenide, gallium phosphide, indium phosphide, indium arsenide, and indium antimonide; an alloy semiconductor including silicon germanium, gallium arsenide phosphide, aluminum indium phosphide, aluminum gallium arsenide, gallium indium arsenide, gallium indium phosphide, and gallium indium arsenide phosphide; or combinations thereof. In embodiments, the substrate 102 may include indium tin oxide (ITO) glass, include silicon on insulator (SOI) substrate, be strained and/or stressed for performance enhancement, include epitaxial regions, doped regions, and/or include other suitable features and layers.

The fins 103 may include one or more layers of semiconductor materials such as silicon or silicon germanium, and may be doped with proper dopants for forming active or passive devices. In an embodiment, the fins 103 include multiple layers of semiconductor materials alternately stacked one over the other, for example, having multiple layers of silicon and multiple layers of silicon germanium alternately stacked. The fins 103 may be patterned by any suitable method. For example, the fins 103 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used as a masking element for patterning the fins 103. For example, the masking element may be used for etching recesses into semiconductor layers over or in the substrate 102, leaving the fins 103 on the substrate 102. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins 103 may be suitable.

The isolation structure 107 may include silicon oxide ($SiO_2$), silicon nitride ($Si_3N_4$), silicon oxynitride (SiON), fluoride-doped silicate glass (FSG), a low-k dielectric material, and/or other suitable insulating material. In an embodiment, the isolation structure 107 is formed by etching trenches in or over the substrate 102 (e.g., as part of the process of forming the fins 103), filling the trenches with an insulating material, and performing a chemical mechanical planarization (CMP) process and/or an etching back process to the insulating material, leaving the remaining insulating material as the isolation structure 107. Other types of isolation structure may also be suitable, such as field oxide and LOCal Oxidation of Silicon (LOCOS). The isolation structure 107 may include a multi-layer structure, for example, having one or more liner layers on surfaces of the substrate 102 and the fins 103 and a main isolating layer over the one or more liner layers.

Referring to FIG. 2, the semiconductor device 100 includes various source and drain (S/D) regions 104 and channel regions 106 between the S/D regions 104. In various embodiments, the S/D regions 104 may be embedded in the fins 103 or may be raised above the fins 103, and channel regions 106 are configured in the fins 103. The 44111111S/D regions 104 may include heavily doped S/D (HDD), lightly doped S/D (LDD), raised regions, strained regions, epitaxially grown regions, and/or other suitable features. The S/D regions 104 may be formed by etching and epitaxial growth, halo implantation, S/D implantation, S/D activation, and/or other suitable processes. In an embodiment, the S/D regions 104 further include silicidation or germanosilicidation. For example, silicidation may be formed by a process that includes depositing a metal layer, annealing the metal layer such that the metal layer is able to react with silicon to form silicide, and then removing the non-reacted metal layer.

Each of the gate stacks 108 may be a multi-layer structure. Further, the gate stacks 108 may have the same or different structures and materials among them. The following description applies to any one of the gate stacks 108. In an embodiment, the gate stacks 108 include an interfacial layer and a polysilicon (or poly) layer over the interfacial layer. In some embodiments, the gate stacks 108 may further include a gate dielectric layer and a metal gate layer disposed between the interfacial layer and the poly layer. In some embodiments, the gate stacks 108 include one or more metal layers in place of the poly layer. In various embodiments, the interfacial layer may include a dielectric material such as silicon oxide ($SiO_2$) or silicon oxynitride (SiON), and may be formed by chemical oxidation, thermal oxidation, atomic layer deposition (ALD), chemical vapor deposition (CVD), and/or other suitable methods. The poly layer can be formed by suitable deposition processes such as low-pressure chemical vapor deposition (LPCVD) and plasma-enhanced CVD (PECVD). The gate dielectric layer may include a high-k dielectric layer such as hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate (Sr-$TiO_3$), other suitable metal-oxides, or combinations thereof; and may be formed by ALD and/or other suitable methods. The metal gate layer may include a p-type work function metal layer or an n-type work function metal layer. The p-type work function metal layer comprises a metal selected from, but not limited to, the group of titanium nitride (TiN), tantalum nitride (TaN), ruthenium (Ru), molybdenum (Mo), tungsten (W), platinum (Pt), or combinations thereof. The n-type work function metal layer comprises a metal selected from, but not limited to, the group of titanium (Ti), aluminum (Al), tantalum carbide (TaC), tantalum carbide nitride (TaCN), tantalum silicon nitride (TaSiN), or combinations thereof. The p-type or n-type work function metal layer may include a plurality of layers and may be deposited by CVD, PVD, and/or other suitable process. The one or more metal layers may include aluminum (Al), tungsten (W), cobalt (Co), copper (Cu), and/or other suitable materials, and may be formed by CVD, PVD, plating, and/or other suitable processes. The gate stacks 108 may be formed in a gate-first process or a gate-last process (i.e., a replacement gate process).

A dielectric layer 110 is disposed over the gate stacks 108. In an embodiment, the dielectric layer 110 includes a metal oxide, a metal nitride, or other suitable dielectric materials. For example, the metal oxide may be titanium oxide ($TiO_2$), aluminum oxide ($Al_2O_3$), or other metal oxides. For example, the metal nitride may be titanium nitride (TiN), aluminum nitride (AlN), aluminum oxynitride (AlON), tantalum nitride (TaN), or other metal nitrides. The dielectric layer 110 may be formed over the gate stacks 108 by one or more deposition and etching processes.

Gate spacers 112 are disposed on sidewalls of the gate stacks 108 and on sidewalls of the dielectric layer 110. The gate spacers 112 may be a single layer or multi-layer structure. In an embodiment, the gate spacer 112 includes a low-k (e.g., k<7) dielectric material. In some embodiments, the gate spacer 112 includes a dielectric material, such as silicon oxide ($SiO_2$), silicon nitride ($Si_3N_4$), silicon oxynitride (SiON), other dielectric material, or combination thereof. In an example, the gate spacers 112 are formed by blanket depositing a first dielectric layer (e.g., a $SiO_2$ layer having a uniform thickness) as a liner layer over the device 100 and a second dielectric layer (e.g., a $Si_3N_4$ layer) as a main D-shaped spacer over the first dielectric layer, and then, anisotropically etching to remove portions of the dielectric layers to form the gate spacers 112.

A contact etch stop (CES) layer 114 is disposed over the fins 103, the S/D regions 104, and the spacers 112. The CES layer 114 may include a dielectric material such as silicon nitride ($Si_3N_4$), silicon oxide ($SiO_2$), silicon oxynitride (SiON), and/or other materials. The CES layer 114 may be formed by PECVD process and/or other suitable deposition or oxidation processes.

An interlayer dielectric (ILD) layer 116 is disposed over the CES layer 114. The ILD layer 116 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 116 may be deposited by a PECVD process, a flowable CVD (FCVD) process, or other suitable deposition technique.

Various S/D contacts 118 are disposed over and in electrical contact with the S/D regions 104 (e.g., through a silicide layer). In an embodiment, the contacts 118 include a metal such as aluminum (Al), tungsten (W), copper (Cu), cobalt (Co), titanium (Ti), titanium nitride (TiN), combinations thereof, or other suitable conductive material. In an embodiment, the S/D contacts 118 are deposited using a suitable process, such as CVD, PVD, plating, and/or other suitable processes.

A dielectric layer 120 is disposed over the S/D contacts 118. The dielectric layer 120 may include a metal oxide (e.g., $TiO_2$ and $Al_2O_3$), a metal nitride (e.g., TiN, AlN, AlON, and TaN), or other suitable dielectric materials. In various embodiments, the dielectric layers 110 and 120 include the same or different materials, and the dielectric layer 120 and the ILD layer 116 may include the same or different materials. The dielectric layer 120 may be deposited using PVD, CVD, or other deposition methods. In an embodiment, after the dielectric layers 110, 116, and 120 are deposited, a chemical mechanical planarization (CMP) process is performed to planarize a top surface the device 100. As a result, top surfaces of the various layers, 110, 112, 114, 116, and 120, are co-planar in some embodiment.

Another CES layer 124 is disposed over the various layers 112, 114, 116, 120, and 122. The CES layer 124 and the CES layer 114 may comprise the same or different materials in various embodiments.

Various vias 136 are disposed directly over and in physical contact with the gate stacks 108 and the S/D contacts 118. In some embodiments, the vias 136 contacting the gate stacks 108 are also referred to as gate vias, while the vias 136 contacting the S/D contacts 118 are also referred to as S/D contact vias. Since the vias 136 are located below the metallization layers 140, they are also referred to as via-0 in the present embodiment. The vias 136 may be formed by etching via holes into the layers 124, 110, and 120, and depositing one or more conductive materials into the via holes. In an embodiment, the vias 136 include one or more barrier layers on sidewalls of the via holes and in direct contact with the various dielectric layers 124, 110, and 120; and further include a metal fill layer surrounded by the barrier layer(s). The barrier layer may include a conductive material such as Ti, TiN, or TaN; and the metal fill layer may include W, Co, Ru, Cu, or other suitable materials. In a particular embodiment, the vias 136 include only the metal fill layer and is free of any barrier layer between the metal fill layer and the surrounding dielectric materials. To further this embodiment, the vias 136 may include tungsten (W) in direct contact with the dielectric layers that surround the vias 136. One benefit of having such via structure (e.g., having W without any barrier layer) is that the vias 136 can be made very small in order to increase the device integration density.

Still referring to FIG. 2, the metallization layers 140 are disposed above the vias 136. In the present embodiment, the metallization layers 140 include a first metallization layer 150, a second metallization layer 160, and a third metallization layer 170. The metallization layers 140 may include additional metallization layers over the metallization layer 170 in some embodiments. The various metallization layers are further described below.

The metallization layer 150 includes conductors 154 disposed in a dielectric layer 151. The dielectric layer 151 may include one layer of dielectric material(s) or multiple layers of dielectric materials. The dielectric layer 151 may include a low-k dielectric material such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The dielectric layer 151 may be deposited by a PECVD process, or other suitable deposition technique. In an embodiment, the conductors 154 may include a barrier layer surrounding a metal fill layer, where the barrier layer includes Ti, TiN, TaN, or other suitable materials, and the metal fill layer includes Co, Ru, Cu, or other suitable materials. The conductors 154 are in direct contact with the vias 136 to provide electrical connections to some of the source, drain, and gate terminals of the transistors in the semiconductor device 100. In some embodiments, the metallization layer 150 is also referred to as the M1 layer.

In some embodiments, the conductors 154 and the vias 136 are each formed by a separate single damascene process. For example, the vias 136 are formed by a process that includes etching via holes into the dielectric layers 124, 110, and 120; filling the via holes with one or more conductive materials; and planarizing the conductive materials. Thereafter, the dielectric layer 151 is deposited over the layer 124 and the vias 136. The dielectric layer 151 is subsequently etched to form trenches. Then, one or more conductive materials are filled into the trenches and are planarized to form the conductors 154. In these embodiments, the conductors 154 and the vias 136 may have the same or different materials. In an embodiment, the conductors 154 and the vias 136 include different materials. For example, the conductors 154 include copper but not tungsten while the vias 136 include tungsten but not copper.

In some embodiments, the conductors 154 and the vias 136 are collectively formed by a dual damascene process. In these embodiments, the vias 136 are not formed until after the dielectric layer 151 is deposited, and the vias 136 and the conductors 154 include the same material(s). In an example implementation, after the dielectric layers 124 and 151 are deposited, the dielectric layer 151 is etched to form trenches. Through the trenches, the dielectric layers 124, 110, and 120 are etched to form via holes. Then, one or more conductive materials are deposited into the via holes and the trenches to form the vias 136 and the conductors 154 simultaneously. In an embodiment, the materials for the conductors 154 and the vias 136 include a Co layer over a TiN layer over a Ti layer. In an alternative embodiment, the materials for the conductors 154 and the vias 136 include a Ru layer over a Ti layer over another Ti layer. In yet another embodiment, the materials for the conductors 154 and the vias 136 include a Cu layer over a TaN layer.

Still referring to FIG. 2, the metallization layer 160 includes a dielectric layer 161, and vias 162 and conductors 164 disposed in the dielectric layer 161. The dielectric layer 161 may include one layer of dielectric material(s) or multiple layers of dielectric materials. The dielectric layer 161 may include materials similar to those in the dielectric layer 151. The vias 162 and the conductors 164 may include materials similar to those in the vias 136 and the conductors 154, respectively. The vias 162 and the conductors 164 may be formed by two separate single damascene processes, or collectively by one dual damascene process, similar to the formation of the vias 136 and the conductors 154 as discussed above. In the present embodiment, the vias 162 and the conductors 164 are formed by a dual damascene process and include the same materials, such as copper over a TiN or TaN adhesion layer. In the present embodiment, the metallization layer 160 is also referred to as the M2 layer.

The metallization layer 170 includes a dielectric layer 171, and vias 172 and conductors 174 disposed in the dielectric layer 171. The dielectric layer 171 may include one layer of dielectric material(s) or multiple layers of dielectric materials. The dielectric layer 171 may include materials similar to those in the dielectric layer 151. The vias 172 and the conductors 174 may include materials similar to those in the vias 136 and the conductors 154, respectively. The vias 172 and the conductors 174 may be formed by two separate single damascene processes, or collectively by one dual damascene process, similar to the formation of the vias 136 and the conductors 154 as discussed above. In the present embodiment, the vias 172 and the conductors 174 are formed by a dual damascene process and include the same materials, such as copper over a TiN or TaN adhesion layer. In the present embodiment, the metallization layer 170 is also referred to as the M3 layer.

Figure 3:
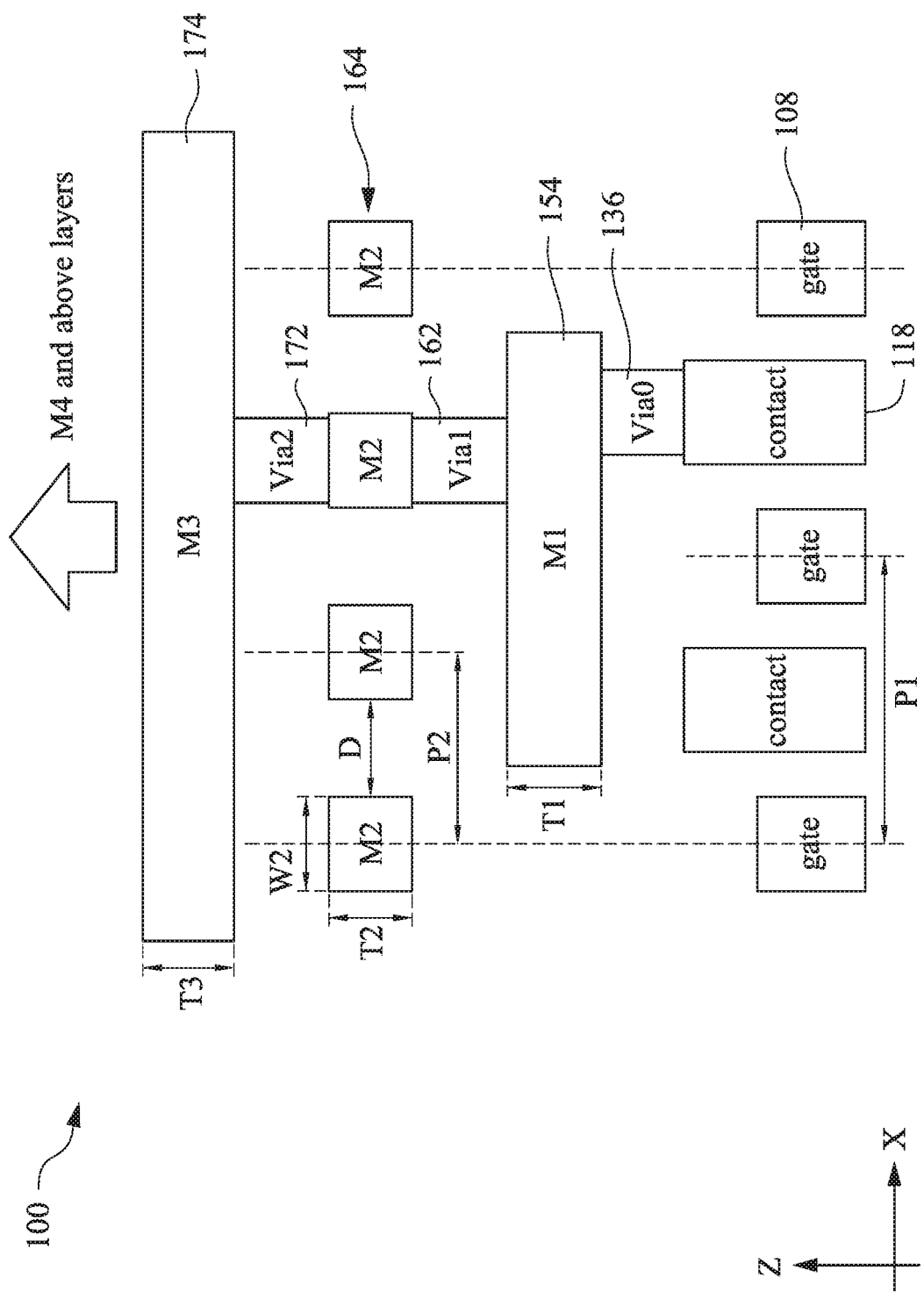
FIG. 3 shows a cross-sectional view of various components of the semiconductor device of FIG. 1, in part, in accordance with some embodiments.
Figure 4B:
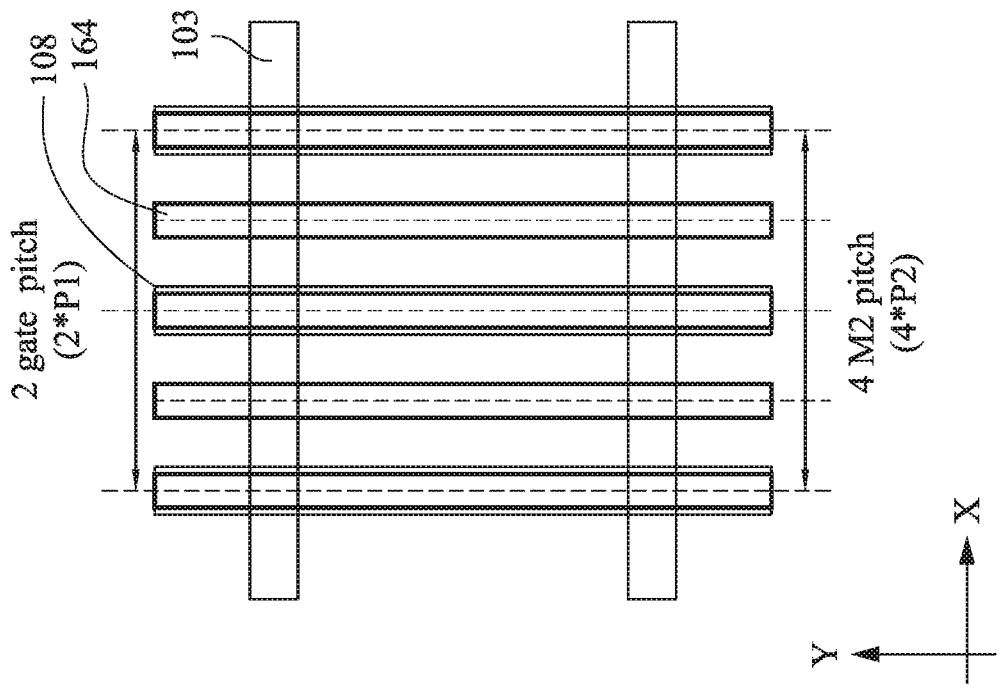
FIGS. 4A and 4B illustrate top views of some components of the semiconductor device of FIG. 1, in part, in accordance with some embodiments.
Figure 4A:
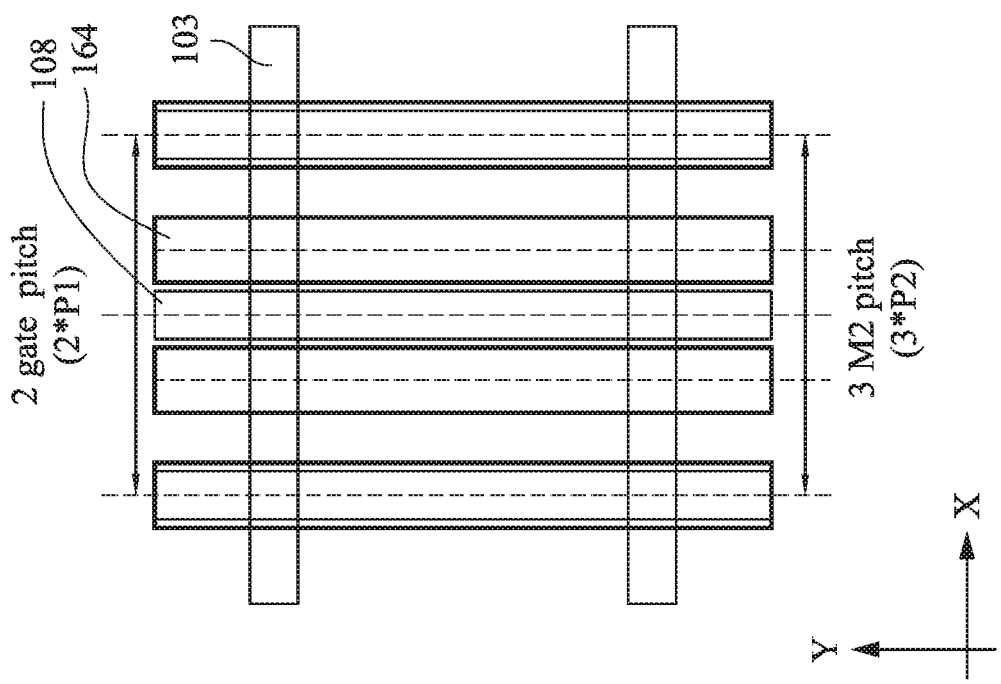

In the present embodiment, the conductors 154 and 174 are oriented lengthwise generally along the X direction, while the conductors 164 are oriented lengthwise generally along the Y direction (extending into the page of FIG. 2). In other words, the conductors 154 and 174 are generally parallel to the lengthwise direction of the fins 103, while the conductors 164 are generally parallel to the lengthwise direction of the gate stacks 108 (see FIG. 1 and FIG. 5B). Further, the conductors 154, 164, and 174 have thicknesses T1, T2, and T3, respectively, along the Z direction. FIG. 3 further illustrates various dimensions of the conductive features in the semiconductor device 100. The dielectric features are not shown in FIG. 3 for the purposes of simplicity.

Referring to FIGS. 2 and 3 collectively, various dimensions of the conductors 154, 164, and 174 are discussed below. In an embodiment, the conductors 164 mainly provide for routing high frequency signals. Therefore, coupling capacitance C between adjacent conductors 164 is of particular concern, where C=εA/D, ε is the permittivity of the dielectric material of the dielectric layer 161, A is the area of the capacitor and equals to T2 times the length of the conductors 164 along the Y direction (see FIG. 4A for an example), and D is the distance between the two conductors 164 along the X direction. Therefore, when the thickness T2 is reduced, the coupling capacitance between adjacent conductors 164 is advantageously reduced. In contrast, the conductors 154 and 174 mainly provide for routing power lines and/or long interconnects. Therefore, lower resistance in the conductors 154 and 174 is generally desired for reducing power consumption of the IC and for reducing power drop along the power lines. Also, since power lines are relatively static, coupling capacitance on these conductors 154 and 174 generally is not a concern. Therefore, in the present embodiment, T2 is designed to be thinner than both T1 and T3. In an embodiment, T2 is thinner than both T1 and T3 by at least 10% to realize the benefits of reduced coupling capacitance. However, T2 generally cannot be too small because when T2 decreases, the resistance in the conductors 164 increases. Since signal propagation delay along the conductors 164 is related to both the coupling capacitance and the resistance, the reduced coupling capacitance and the increased resistance in the conductors 164 must both be considered and balanced. In an embodiment, the ratio of T2 to T1 (T2:T1) is in a range from 0.5 to 0.95. In another embodiment, the ratio of T2 to T1 (T2:T1) is in a range from 0.8 to 0.9. In some embodiments, the ratio of T2 to T3 (T2:T3) is in a range from 0.5 to 0.95. In some other embodiments, the ratio of T2 to T3 (T2:T3) is in a range from 0.8 to 0.9. In the above ranges, the lower limits are designed to guard against the effects of increased resistance in the conductors 164, and the upper limits are designed to take advantage of the reduced coupling capacitance in the conductors 164. In other words, if the ratios (T2:T1 and T2:T3) are smaller than the disclosed range, the increased resistance in the conductors 164 may outweigh the benefits of the reduced capacitance thereof, and if the ratios (T2:T1 and T2:T3) are greater than the disclosed range, then the effects of the reduced capacitance in the conductors 164 are not meaningful enough for some applications.

In conventional designs, conductors in a higher metallization layer are designed to be thicker than those in the lower metallization layer. For example, conductors in M2 layer are conventionally designed to be thicker than conductors in M1 layer. Such designs suffer from reduced frequency response due to higher coupling capacitance between adjacent conductors in the M2 layer. To alleviate this problem, some designs may increase the space D between adjacent conductors in the M2 layer. However, this would reduce device integration density, thereby increasing the costs of making the semiconductor devices. In contrast, by designing the conductors 164 to be thinner (particularly, thinner than the conductors 154 and 174 in the present embodiment), the coupling capacitance C is reduced in the M2 layer compared to conventional designs. Accordingly, the semiconductor device 100 provides better frequency response than conventional designs.

There is another unexpected benefit of the reduced thickness T2. As discussed above, the conductors 164 are formed by etching trenches into the dielectric layer 161 and filling the trenches with one or more conductive materials (e.g., metals). The aspect ratio (AR) of the trenches is an important factor in determining how easy (or difficult) the trenches can be filled with metals. The aspect ratio is defined as the ratio of the height of the trenches (which is T2) to the width W2 of the trench (i.e., AR=T2:W2). When T2 is reduced, this aspect ratio is also reduced, indicating that the trenches are easier to be filled with metals. Furthermore, in various embodiments, the width W2 of the conductors 164, the spacing D between the conductors 164, or both W2 and D can be reduced (thanks to the reduced thickness T2) in order to increase the number of conductors in the metallization layer 160, which advantageously increases the design density. In an embodiment, a pitch P2 of the conductors 164 along the X direction is designed to be smaller than a pitch P1 of the gate stacks 108 along the X direction. In FIG. 3, the pitches P1 and P2 are defined using centerline-to-centerline distance. Alternatively, they can be defined using edge-to-edge distance. In an embodiment, a ratio of P2:P1 is designed to be about 2:3 or smaller, such as about 1:2. If the ratio of P2:P1 is too big (e.g., much greater than 2:3), then the conductor density of the M2 layer (e.g., the number of conductors 164 per unit area of the M2 layer) may be too small, and there may not be enough routing resources for the standard cells. If the ratio of P2:P1 is too small (e.g., much smaller than 1:2), the distance D may be too small and the coupling capacitance C between adjacent conductors 164 may be too great. In the embodiment shown in FIGS. 3 and 4A, the ratio of P2:P1 is about 2:3 (in other words, 3·P2 is about equal to 2·P1). In the embodiment shown in FIG. 4B, the ratio of P2:P1 is about 1:2 (in other words, 2·P2 is about equal to P1). Further, in the embodiment shown in FIG. 4B, the conductors 164 are designed to be narrower than the gate stacks 108.

In some embodiments, the vias 162 are also designed to be thinner (along the Z direction) than conventional vias in the same layer. In an embodiment, the vias 162 have about same width and length (along the X and Y directions) as the vias 172, but have smaller height (along the Z direction) than the vias 172. In some embodiments, the vias 162 have smaller width, smaller length, and smaller height than the vias 172. In some embodiments, the vias 136 may be designed to be longer (along the Z direction) than the vias 162, for example, for reaching onto the top of the gates 108. In some embodiments, the vias 136 may be designed to be shorter (along the Z direction) than the vias 162, for example, for reducing resistance in the connection. In various embodiments, the thickness of the dielectric layers 151, 161, and 171 may be designed to be the same or different. In an embodiment, the dielectric layer 161 is designed to be thinner than the dielectric layer 171 because T2 is smaller than T3. In an embodiment, the dielectric layer 161 is designed to be thinner than the dielectric layer 151 because T2 is smaller than T1.

Figure 5A:
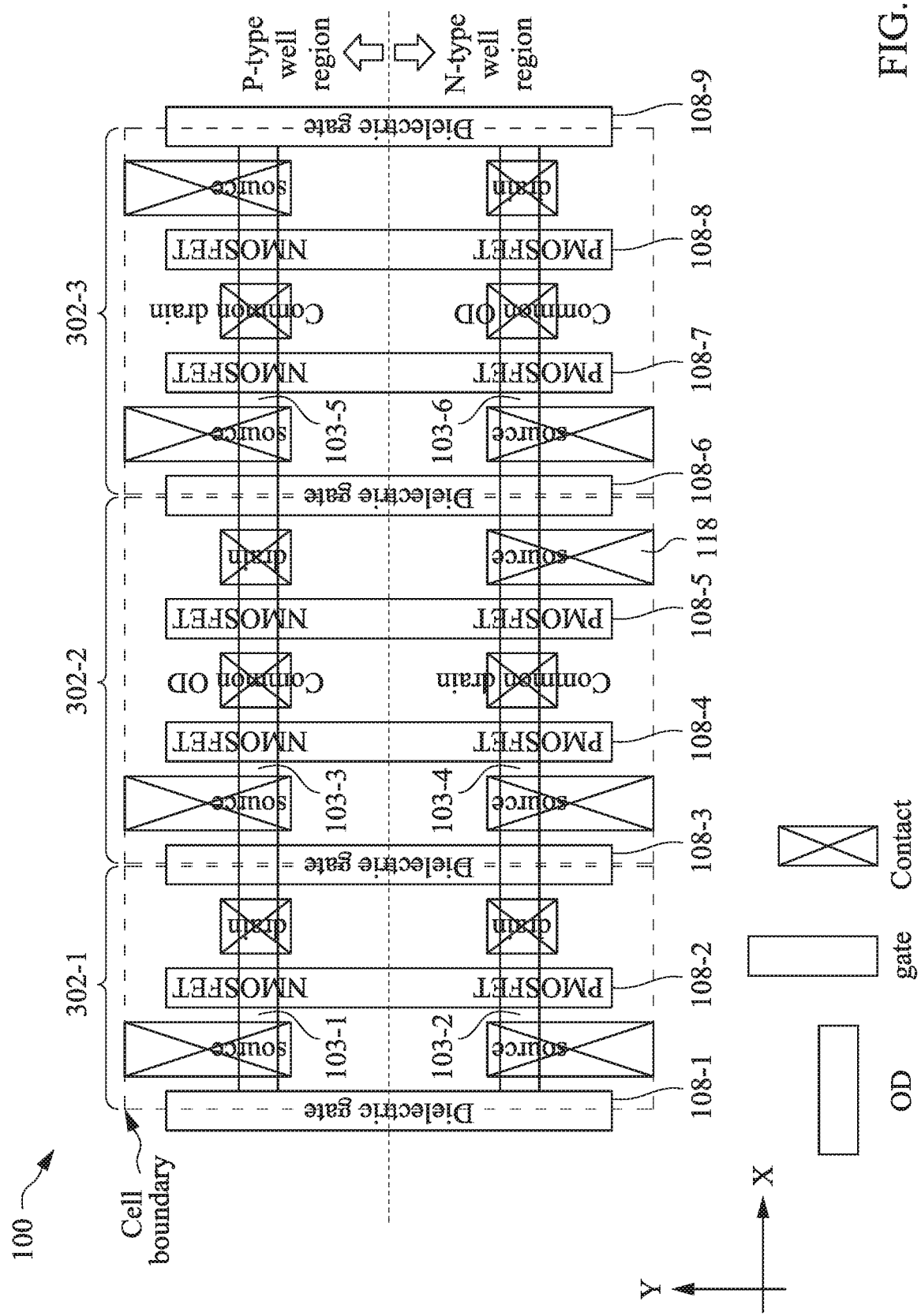
FIGS. 5A, 5B, 5C, 5D, and 6 show layout diagrams of (also top views of) some components of the semiconductor device of FIG. 1, in part, in accordance with some embodiments.

FIGS. 5A-7 illustrate various layout diagrams of the semiconductor device 100, showing various components of the device 100 from a top view, in accordance with some embodiments. Particularly, FIG. 5A illustrates the layout of the fins 103, the gate stacks 108, and the contact features 118. Referring to FIG. 5A, the semiconductor device 100 includes various standard cells 302 (including 302-1, 302-2, and 302-3). Each of the standard cells 302 includes CMOSFETs having one or more PMOSFETs formed in an N-type well region and one or more NMOSFETs formed in a P-type well region. The boundaries of the standard cells 302 abut one another. Each of the standard cells 302 may implement a digital circuit function, such as inverter, NAND, NOR, AND, OR, or flip-flop.

In this embodiment, the various fins 103 (including 103-1, 103-2, 103-3, 103-4, 103-5, and 103-6) are oriented lengthwise along the X direction. The fins 103-1, 103-3, and 103-5 are disposed along the same track, but separated from each other at the cell boundaries. Similarly, the fins 103-2, 103-4, and 103-6 are disposed along the same track, but separated from each other at the cell boundaries. The various gate stacks 108 (including 108-1, 108-2, 108-3, 108-4, 108-5, 108-6, 108-7, 108-8, and 108-9) are oriented lengthwise along the Y direction. In this embodiment, the gate stacks 108-2, 108-4, 108-5, 108-7, and 108-8 engage the fins to form FinFETs in the respective standard cells, are therefore referred to as functional gates. The gate stacks 108-2, 108-4, 108-5, 108-7, and 108-8 may include a gate dielectric layer and a gate electrode as discussed with respect to FIG. 2. The gate stacks 108-1, 108-3, 108-6, and 108-9 are dielectric gates (or dummy gates) and are disposed on the boundaries of the standard cells to isolate the standard cells 302 from one another. The dielectric gates may include a dielectric material such as silicon oxide or silicon nitride.

Figure 5B:
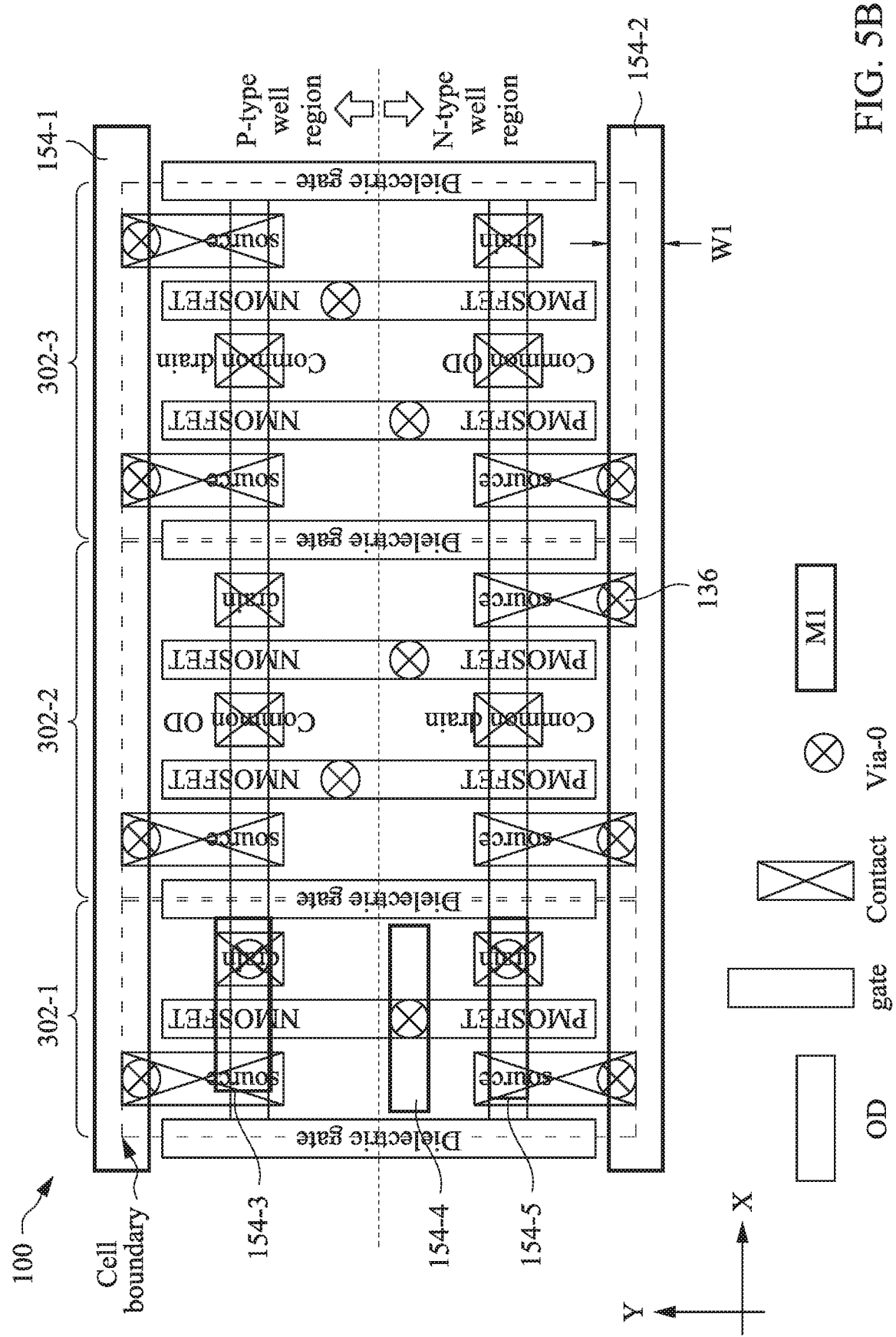

FIG. 5B is the same as FIG. 5A with the addition of the via-0 layer and the M1 layer, in accordance with some embodiments. Referring to FIG. 5B, the via-0 layer includes various vias 136, and the M1 layer includes various conductors 154 (including 154-1, 154-2, 154-3, 154-4, and 154-5). It is noted that not all conductors 154 are shown in FIG. 5B. The conductors 154 are oriented lengthwise along the X direction, generally parallel to the fins 103. Some of the conductors 154 provide for power line routing. For example the conductor 154-1 may route the ground line or Vss line, while the conductor 154-2 may route the Vdd line. As a result, some of the conductors 154 are relatively long, and may traverse multiple standard cells 302. These conductors 154 are designed to have proper thickness T1 (see FIG. 3) and width W1 to reduce the resistance thereof. The vias 136 are disposed on various source, drain, and gate terminals of the transistors, and provide electrical connection between those terminals and the conductors 154.

Figure 5C:
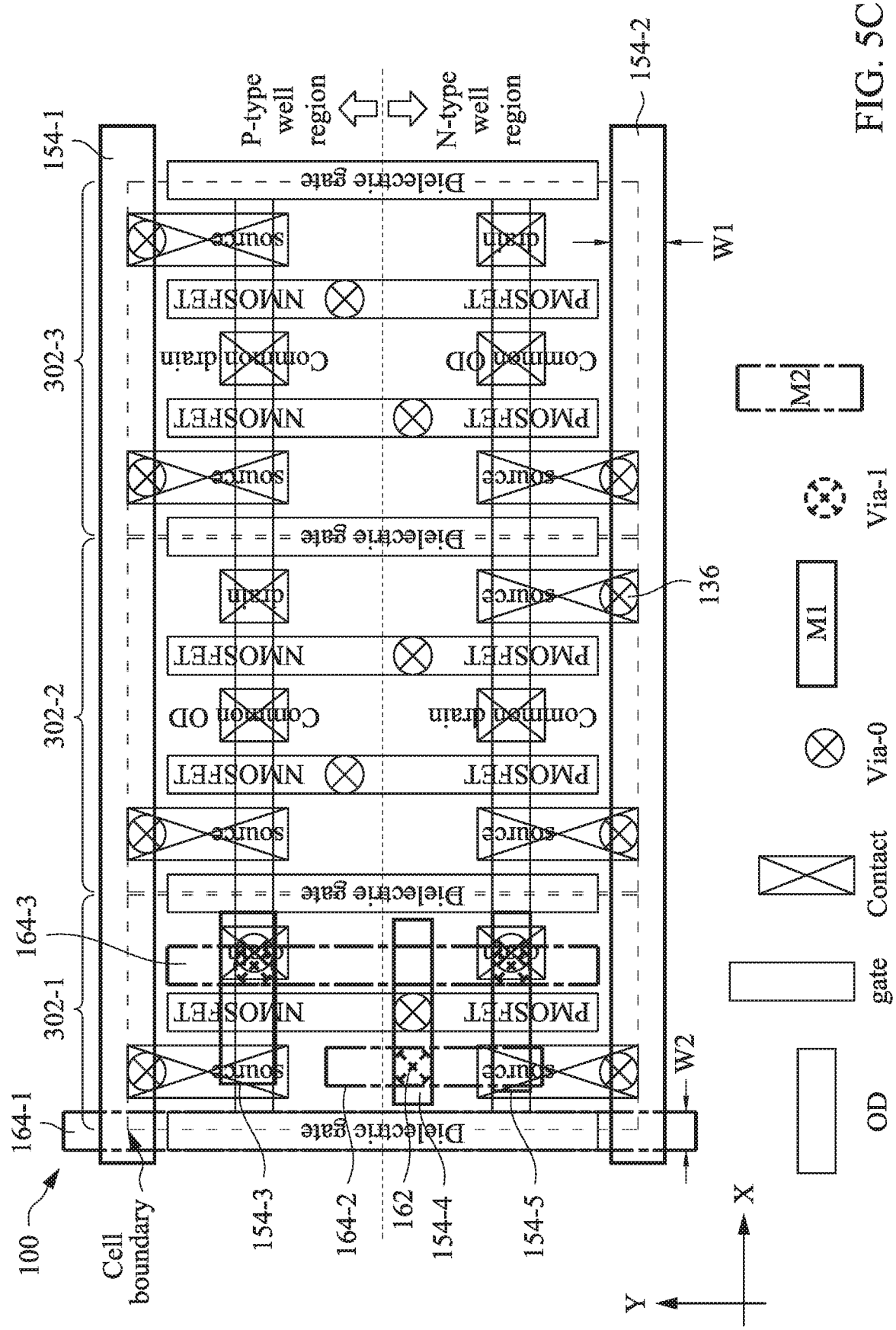

FIG. 5C is the same as FIG. 5B with the addition of the via-1 layer (having vias 162) and the M2 layer (having conductors 164), in accordance with some embodiments. It is noted that not all vias 162 and conductors 164 are shown in FIG. 5C. Referring to FIG. 5C, the conductors 164 (including 164-1, 164-2, and 164-3) are oriented lengthwise along the Y direction, generally parallel to the gate stacks 108. Many of the conductors 164 provide connections within individual standard cells. Therefore, the conductors 164 are relatively shorter than the conductors 154. Some of the conductors 164 (e.g., 164-3) provide electrical connections between CMOSFET drain terminals. Some of the conductors 164 provide high frequency signal lines. Therefore, their thickness T2 (FIG. 3) are designed to be smaller than the thicknesses T1 and T3 as discussed above. In a further embodiment, the width W2 of the conductors 164 along the X direction (FIG. 5C) may be designed smaller than the width W1 of the conductors 154 along the Y direction (FIG. 5B). The vias 162 are disposed on the conductors 154, and provide electrical connection between the conductors 154 and the conductors 164.

Figure 5D:
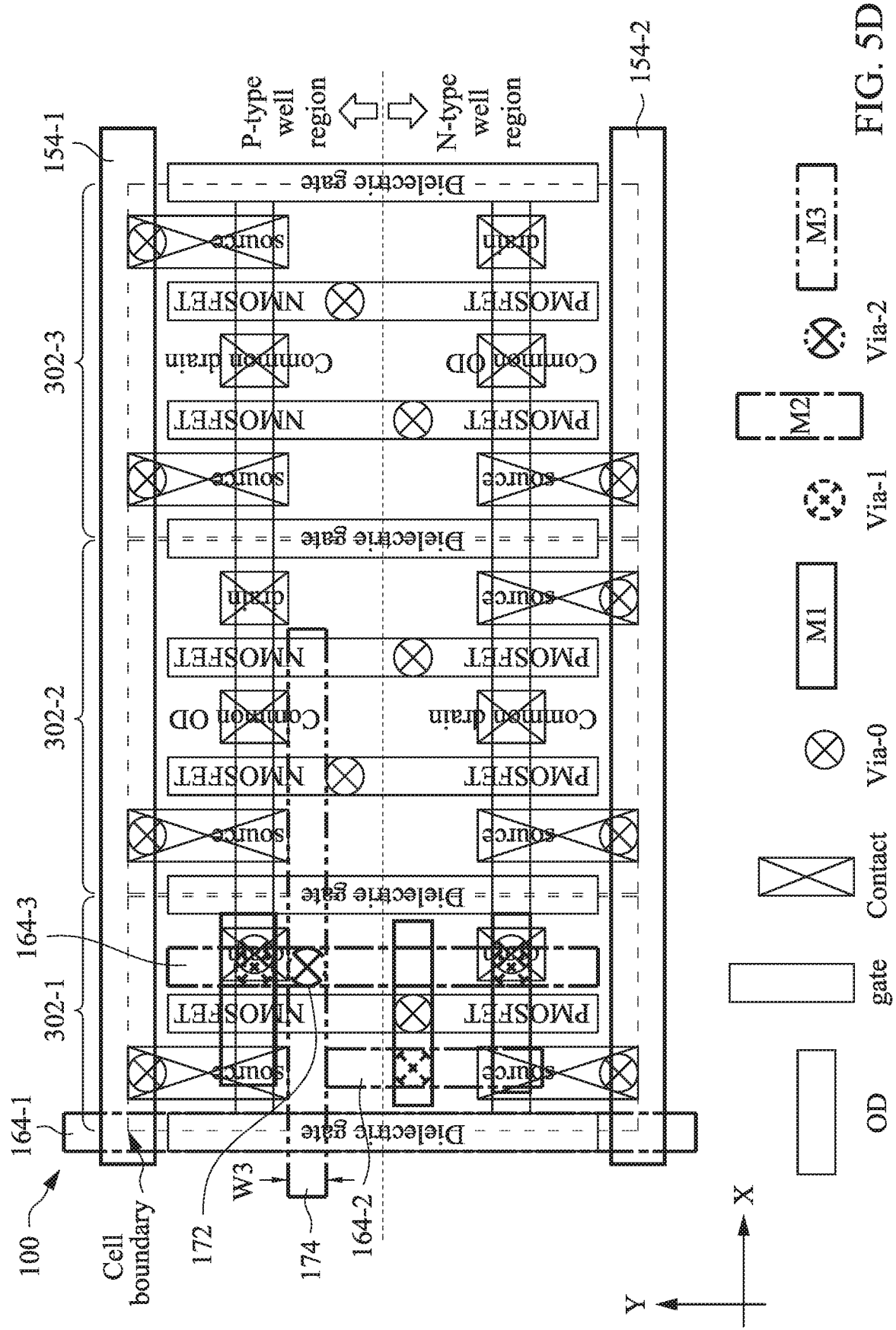

FIG. 5D is the same as FIG. 5C with the addition of the via-2 layer (having vias 172) and the M3 layer (having conductors 174), in accordance with some embodiments. It is noted that not all vias 172 and conductors 174 are shown in FIG. 5D. Referring to FIG. 5D, the conductors 174 are oriented lengthwise along the X direction, generally parallel to the fins 103. Some of the conductors 174 provide for power line (e.g., Vdd, Vss, and/or ground) routing. Therefore, some of the conductors 174 are relatively long, and may traverse multiple standard cells 302. The conductors 174 are designed to have proper thickness T3 (see FIG. 3) and width W3 (along the Y direction) to reduce the resistance thereof. In an embodiment, the width W3 is designed to be greater than the width W2. In another embodiment, the thicknesses T1 and T3 are designed to be about the same. In yet another embodiment, the widths W1 and W3 are designed to be about the same. Even though not shown, the pitch of the conductors 174 (along the Y direction) may be designed to be about the same as the pitch of the conductors 154 (along the Y direction) in some embodiment. The vias 172 are disposed on the conductors 164, and provide electrical connection between the conductors 164 and the conductors 174.

Figure 6:
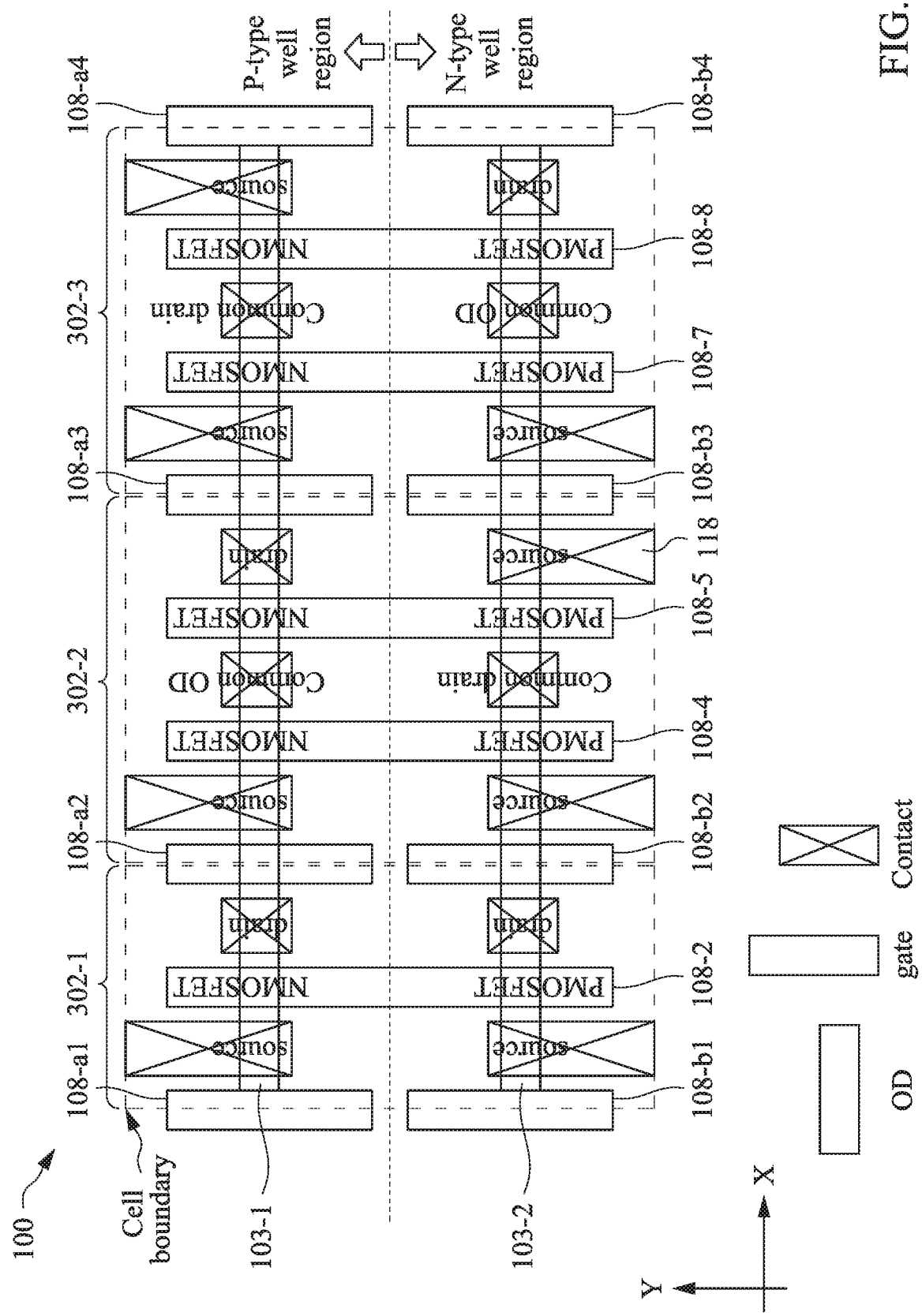

FIG. 6 illustrates the layout of the semiconductor device 100, in accordance with another embodiment. For the purposes of simplicity, FIG. 6 only shows the fins 103, the gate stacks 108, and the contacts 118. Other layers of the semiconductor device 100 may be designed similar to those illustrated in FIGS. 5B-5D. Referring to FIG. 6, in this embodiment, the fins 103 (including 103-1 and 103-2) traverse multiple standard cells 302. Some of the gate stacks 108-*a*1, 108-*a*2, 108-*a*3, 108-*a*4, 108-*b*1, 108-*b*2, 108-*b*3, and 108-*b*4 are disposed along the boundaries of the standard cells 302. The gate stacks 108-*a*1, 108-*a*2, 108-*a*3, 108-*a*4, 108-*b*1, 108-*b*2, 108-*b*3, and 108-*b*4 may have the same composition as the functional gates 108-2, 108-4, 108-5, 108-7, and 108-8. But they are tied to a fixed voltage to function as isolation features between standard cells 302. For example, the gate stacks 108-*a*1, 108-*a*2, 108-*a*3, and 108-*a*4 may be tied to Vss or ground, and the gate stacks 108-*b*1, 108-*b*2, 108-*b*3, and 108-*b*4 may be tied to Vdd. Other aspects of the semiconductor device 100 in the embodiment in FIG. 6 are the same as or similar to those in FIGS. 5A-5D.

Figure 7:
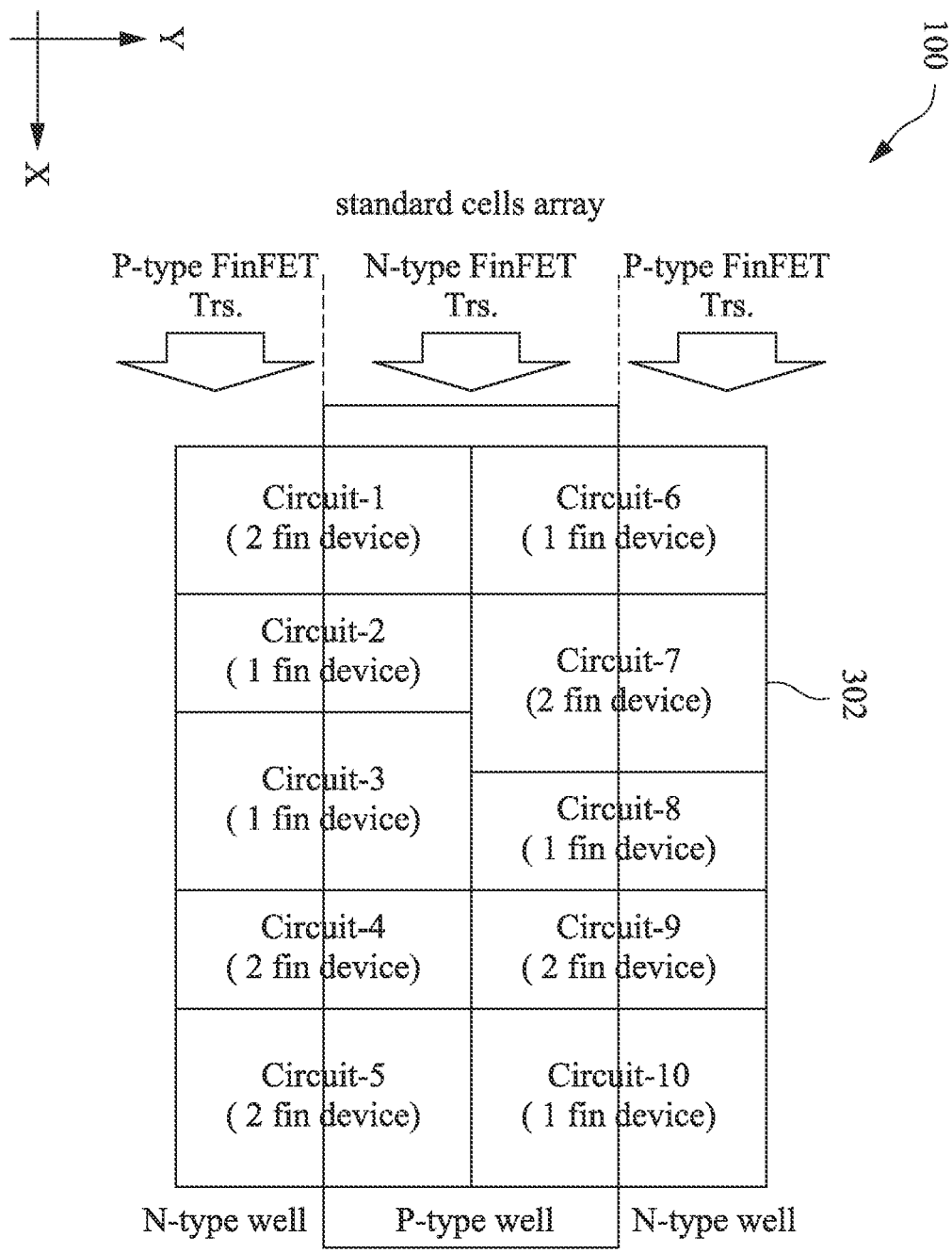
FIG. 7 illustrates a layout diagram of the semiconductor device of FIG. 1, in part, in accordance with some embodiments.

FIG. 7 illustrates a layout of the semiconductor device 100, in accordance with some embodiment. Referring to FIG. 7, the semiconductor device 100 includes various abutting standard cells 302 built over P-type well regions and N-type well regions. In this embodiment, a P-type well region is sandwiched between two N-type well regions. There are N-type FinFET transistors in the P-type well region, and P-type FinFET transistors in the N-type well regions. Each of the standard cells 302 includes CMOSFETs having N-type FinFET transistor(s) and P-type FinFET transistor(s) integrated. Some of the FinFET transistors may include one fin, and some of the FinFET transistors may include multiple fins.

Although not intended to be limiting, one or more embodiments of the present disclosure provide many benefits to a semiconductor device and the formation thereof. For example, embodiments of the present disclosure provide M1, M2, and M3 metal structures for integrate circuits that provide for reduced coupling capacitance for high switching conductors in the M2 layer and reduced resistance for power line conductors in the M1 and M3 layers. This increases the frequency response of the IC and reduces the power consumption of the IC at the same time. Furthermore, conductors in the M2 layer can be made more compact than the conventional designs, thereby increasing the integration density of the ICs.

In one exemplary aspect, the present disclosure is directed to a semiconductor device. The semiconductor device includes transistors formed over a substrate, a first metallization layer over the transistors, a second metallization layer over the first metallization layer, and a third metallization layer over the second metallization layer. The first metallization layer includes first metal features disposed in a first dielectric layer. The first metal features have a first thickness along a first direction perpendicular to a top surface of the substrate. The second metallization layer includes second metal features disposed in a second dielectric layer. The second metal features have a second thickness along the first direction. The third metallization layer includes third metal features disposed in a third dielectric layer. The third metal features have a third thickness along the first direction. The second thickness is smaller than both the first and the third thicknesses. The second metal features are oriented lengthwise substantially perpendicular to the first metal features. The third metal features are oriented lengthwise substantially parallel to the first metal features.

In an embodiment of the semiconductor device, the second thickness is smaller than each of the first and the third thicknesses by at least 10%. In another embodiment, some of the first and the third metal features are configured for routing power lines in the semiconductor device, and the second metal features are free of power lines.

In some embodiments, the transistors include gate stacks that are oriented lengthwise along a second direction, and the second metal features are oriented lengthwise along a direction substantially parallel to the second direction. In a further embodiment, the gate stacks are spaced from each other with a first pitch, the second metal features are spaced from each other with a second pitch smaller than the first pitch. In a further embodiment, a ratio of the second pitch to the first pitch is about 2:3 or about 1:2.

In an embodiment, the semiconductor device further includes contact features over source/drain features of the transistors; first via features landed on the contact features, wherein the first metal features directly contact the first via features; second via features landed on the first metal features, wherein the second metal features directly contact the second via features; and third via features landed on the second metal features, wherein the third metal features directly contact the third via features. In a further embodiment, the first via features include tungsten (W) in direct contact with a dielectric layer that surrounds the first via features.

In an embodiment of the semiconductor device, a ratio of the second thickness to the first thickness is in a range from 0.5 to 0.95. In another embodiment, the first thickness and the third thickness are about same.

In another exemplary aspect, the present disclosure is directed to a semiconductor device. The semiconductor device includes FinFET transistors over a substrate, the FinFET transistors being arranged into abutting standard cells, each standard cell including a p-type FinFET transistor and an n-type FinFET transistor, gate stacks of the FinFET transistors being oriented lengthwise along a first direction. The semiconductor device further includes a first metallization layer over the FinFET transistors, the first metallization layer including first metal features disposed in a first dielectric layer, the first metal features being oriented lengthwise along a second direction substantially perpendicular to the first direction, the first metal features having a first thickness along a third direction perpendicular to a top surface of the substrate. The semiconductor device further includes a second metallization layer over the first metallization layer, the second metallization layer including second metal features disposed in a second dielectric layer, the second metal features being oriented lengthwise substantially parallel to the first direction, the second metal features having a second thickness along the third direction. The semiconductor device further includes a third metallization layer over the second metallization layer, the third metallization layer including third metal features disposed in a third dielectric layer, the third metal features being oriented lengthwise substantially parallel to the second direction, the third metal features having a third thickness along the first direction, wherein the second thickness is smaller than both the first and the third thicknesses.

In an embodiment of the semiconductor device, the first metal features include conductors for routing power and ground lines of the semiconductor device, and the second metal features include conductors for routing signals within each of the standard cells. In another embodiment, at least one of the second metal features connects a drain node of a p-type FinFET transistor and a drain node of an n-type FinFET transistor in a same one of the standard cells.

In an embodiment, the semiconductor device further includes isolation gate features disposed along boundaries of the standard cells and oriented lengthwise along the first direction. In a further embodiment, the gate stacks and the isolation gate features collectively have a first pitch along the second direction, the second metal features have a second pitch along the second direction, wherein the second pitch is smaller than the first pitch.

In an embodiment of the semiconductor device, the first and the third thicknesses are about same. In another embodiment, a ratio of the second thickness to the first thickness is in a range from 0.8 to 0.9.

In yet another exemplary aspect, the present disclosure is directed to a semiconductor device. The semiconductor device includes FinFET transistors over a substrate, the FinFET transistors including fins oriented lengthwise along a first direction and gate stacks oriented lengthwise along a second direction substantially perpendicular to the first direction, the FinFET transistors being arranged into abutting standard cells, each standard cell having a substantially rectangular boundary. The semiconductor device further includes a first metallization layer over the FinFET transistors, the first metallization layer including first metal features disposed in a first dielectric layer, the first metal features being oriented lengthwise substantially parallel to the first direction, the first metal features including conductors for routing power and ground lines of the semiconductor device, the first metal features having a first thickness along a third direction perpendicular to the first and the second directions. The semiconductor device further includes a second metallization layer over the first metallization layer, the second metallization layer including second metal features disposed in a second dielectric layer, the second metal features being oriented lengthwise substantially parallel to the second direction, the second metal features including conductors for routing signal lines within the boundary of each standard cell, the second metal features having a second thickness along the third direction, wherein the second thickness is smaller than the first thicknesses by at least 10%.

In an embodiment, the semiconductor device further includes a third metallization layer over the second metallization layer, the third metallization layer including third metal features disposed in a third dielectric layer, the third metal features being oriented lengthwise substantially parallel to the first direction, the third metal features including conductors for routing power and ground lines of the semiconductor device, the third metal features having a third thickness along the third direction, wherein the second thickness is smaller than the third thicknesses by at least 10%.

In an embodiment of the semiconductor device, a dimension of the second metal features along the first direction is narrower than a dimension of the first and the third metal features along the second direction.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a gate stack disposed over a substrate, the gate stack oriented lengthwise along a first direction;
a first metallization layer disposed over the gate stack, the first metallization layer including first metal features disposed in a first dielectric layer, the first metal features having a first thickness, the first thickness being measured in a second direction that is perpendicular to a top surface of the substrate;
a second metallization layer disposed over the first metallization layer, the second metallization layer including second metal features disposed in a second dielectric layer, the second metal features oriented lengthwise along the first direction and having a second thickness, the second thickness measured in the second direction;
a third metallization layer disposed over the second metallization layer, the third metallization layer including third metal features disposed in a third dielectric layer, the third metal features having a third thickness, the third thickness measured in the second direction, wherein the second thickness is smaller than both the first and the third thicknesses;
a first via feature interfacing with the gate stack and one of the first metal features;
a second via feature interfacing with one of the first metal features and one of the second metal features; and
a third via feature interfacing with one of the second metal features and one of the third metal features.

2. The device of claim 1, wherein the first metal features and the third metal features are oriented lengthwise along the second direction that is substantially perpendicular to the first direction.

3. The device of claim 1, wherein a ratio of the second thickness to the first thickness is in a range from about 0.5 to about 0.95.

4. The device of claim 1, wherein a ratio of the second thickness to the third thickness is in a range from about 0.5 to about 0.95.

5. The device of claim 1, wherein the gate stack includes a plurality of gate stacks oriented lengthwise along the first direction,
wherein the plurality of gate stacks are spaced from each other with a first pitch, and
wherein the second metal features are spaced from each other with a second pitch that is different than the first pitch.

6. The device of claim 5, wherein the second pitch is less than the first pitch.

7. A device comprising:
a gate stack disposed over a substrate;
a first metallization layer disposed over and electrically coupled to the gate stack, the first metallization layer including first metal features disposed in a first dielectric layer, the first metal features having a first thickness, the first thickness being measured in a first direction perpendicular to a top surface of the substrate;
a second metallization layer disposed over and interfacing with the first metallization layer, the second metallization layer including second metal features disposed in a second dielectric layer, the second metal features having a second thickness measured in the first direction, the second thickness being less than the first thickness;
a third metallization layer disposed over and interfacing with the second metallization layer, the third metallization layer including third metal features disposed in a third dielectric layer, the third metal features having a third thickness, the third thickness measured in the first direction and being different than the second thickness;
a first via feature interfacing with the gate stack and one of the first metal features;
a second via feature interfacing with one of the first metal features and one of the second metal features; and
a third via feature interfacing with one of the second metal features and one of the third metal features.

8. The device of claim 7, wherein the first metal features are oriented lengthwise substantially perpendicular to the second metal features,
wherein the third metal features are oriented lengthwise substantially parallel to the first metal features, and
wherein the gate stack is oriented lengthwise substantially parallel to the second metal features.

9. The device of claim 7, wherein the first metal features are oriented lengthwise substantially perpendicular to the second metal features,
wherein the third metal features are oriented lengthwise substantially parallel to the first metal features, and
wherein the gate stack is oriented lengthwise substantially perpendicular to the second metal features.

10. The device of claim 7, wherein the third thickness is greater than the second thickness, and wherein the first thickness and the third thickness are about the same.

11. The device of claim 7, wherein the first via feature is shorter than the second via feature, and
wherein the second via feature is shorter than the third via feature.

12. The device of claim 7, further comprising a semiconductor fin feature disposed on the substrate, and
wherein the gate stack interfaces with the semiconductor fin feature; and
wherein the semiconductor fin feature is oriented lengthwise substantially perpendicular to the gate stack.

13. The device of claim 7, wherein the first dielectric layer has a fourth thickness measured in the first direction, and
wherein the second dielectric layer has a fifth thickness measured in the first direction, the fifth thickness being less than the fourth thickness.

14. A device comprising:
semiconductor fins disposed over a substrate;
gate stacks disposed over the semiconductor fins;
a first metallization layer disposed over the gate stacks, the first metallization layer including first metal features disposed in a first dielectric layer, the first metal features oriented lengthwise along a first direction and having a first thickness, the first thickness measured in a second direction that is perpendicular to a top surface of the substrate, the first direction being substantially perpendicular to the second direction;
a second metallization layer disposed directly on the first metallization layer, the second metallization layer including second metal features disposed in a second dielectric layer, the second metal features being oriented lengthwise along a third direction that is substantially perpendicular to the first direction, wherein the second metal features have a second thickness in the second direction that is less than the first thickness;
a first via feature interfacing with one of the gate stacks and one of the first metal features; and
a second via feature interfacing with one of the first metal features and one of the second metal features.

15. The device of claim 14, further comprising a third metallization layer disposed directly on the second metallization layer, the third metallization layer including third metal features disposed in a third dielectric layer, the third metal features being oriented lengthwise along the first direction, wherein the third metal features have a third thickness in the second direction that is greater than the second thickness.

16. The device of clam 15, further comprising a third via feature interfacing with one of the second metal features and one of the third metal features.

17. The device of claim 16, wherein the first via feature is formed of a different material than the first metal feature.

18. The device of claim 15, wherein a ratio of the second thickness to the first thickness is in a range from about 0.5 to about 0.95,
wherein a ratio of the second thickness to the third thickness is in a range from about 0.5 to about 0.95, and
wherein the first and the third thicknesses are about the same.

19. The device of claim 15, wherein a ratio of the second thickness to the first thickness is in a range from about 0.8 to about 0.9,
wherein a ratio of the second thickness to the third thickness is in a range from about 0.8 to about 0.9.

20. The device of claim 14, wherein the gate stacks include at least one gate stack coupled to a fixed voltage.

* * * * *